United States Patent
Tashiro et al.

(10) Patent No.: US 10,731,243 B2
(45) Date of Patent: Aug. 4, 2020

(54) INTERMEDIATE LAYER FORMED BETWEEN BASE MATERIAL AND DLC LAYER AND FILM-FORMING METHOD THEREOF

(71) Applicant: DOWA THERMOTECH CO., LTD., Tokyo (JP)

(72) Inventors: Hiroki Tashiro, Aichi (JP); Hiroyuki Matsuoka, Aichi (JP); Wataru Sakakibara, Aichi (JP); Soichiro Nogami, Gunma (JP); Satoru Habuka, Aichi (JP)

(73) Assignee: DOWA THERMOTECH CO., LTD., Tokyo (JP)

( * ) Notice: Subject to any disclaimer, the term of this patent is extended or adjusted under 35 U.S.C. 154(b) by 137 days.

(21) Appl. No.: 15/781,365

(22) PCT Filed: Dec. 7, 2016

(86) PCT No.: PCT/JP2016/086338
§ 371 (c)(1),
(2) Date: Jun. 4, 2018

(87) PCT Pub. No.: WO2017/099112
PCT Pub. Date: Jun. 15, 2017

(65) Prior Publication Data
US 2018/0363128 A1 Dec. 20, 2018

(30) Foreign Application Priority Data
Dec. 8, 2015 (JP) .................. 2015-239782

(51) Int. Cl.
*C23C 14/06* (2006.01)
*B32B 9/00* (2006.01)
(Continued)

(52) U.S. Cl.
CPC ............ *C23C 14/0635* (2013.01); *B32B 9/00* (2013.01); *C23C 14/0057* (2013.01);
(Continued)

(58) Field of Classification Search
USPC ............ 428/408, 469, 472, 698; 204/192.15, 204/192.16
See application file for complete search history.

(56) References Cited

U.S. PATENT DOCUMENTS 5,215,823 A * 6/1993 Itoh ..................... C23C 14/0605
428/408
2013/0309486 A1 11/2013 Jin et al.
(Continued)

FOREIGN PATENT DOCUMENTS

JP 2004-137541 A 5/2004
JP 2011-225982 * 11/2011
(Continued)

OTHER PUBLICATIONS

Bulbul et al "The Effect of TiC Transient Layer on a DLC-based Functionally Gradient Coating Prepared by Closed Field Unbalanced Magnetron Sputtering Plating System." Met Mater. Int. vol. 16, No. 4 p. 573-580. (Year: 2010).*
(Continued)

*Primary Examiner* — Archene A Turner
(74) *Attorney, Agent, or Firm* — Greenblum & Bernstein, P.L.C.

(57) ABSTRACT

In an intermediate layer formed between a base material and a DLC layer, a Ti layer and a TiC layer formed on a surface of the Ti layer are provided, and a carbon content of the entire layer containing the Ti layer and the TiC layer is 53 at % or more and 77 at % or less.

5 Claims, 2 Drawing Sheets

RAMAN SPECTRUM AT EACH ACETYLENE FLOW RATE RATIO (51) Int. Cl.
  *C23C 28/00* (2006.01)
  *C23C 14/00* (2006.01)
  *C23C 16/02* (2006.01)
  *C23C 16/26* (2006.01)
  *C23C 14/34* (2006.01)
  *C23C 16/27* (2006.01)
  *C23C 14/16* (2006.01)
  *C23C 16/50* (2006.01)

(52) U.S. Cl.
  CPC ............ *C23C 14/165* (2013.01); *C23C 14/34* (2013.01); *C23C 16/029* (2013.01); *C23C 16/26* (2013.01); *C23C 16/27* (2013.01); *C23C 16/50* (2013.01); *C23C 28/322* (2013.01); *C23C 28/341* (2013.01); *C23C 28/343* (2013.01); *C23C 28/36* (2013.01)

(56) References Cited

U.S. PATENT DOCUMENTS

2016/0265099 A1* 9/2016 Watanabe ............... C23C 16/50
2016/0281219 A1   9/2016 Tashiro et al.

FOREIGN PATENT DOCUMENTS

JP   2015-178670 A   10/2015
WO   2015/068776 A   5/2015

OTHER PUBLICATIONS

A.A. Voevodin et al., "Design of a Ti/TiC/DLC functionally gradient coating based on studies of structural transitions in Ti—C thin films", Thin Solid Films, vol. 298, Apr. 20, 1997, pp. 107-115.

Jyh Gwo et al., "Enhancement of Ti-containing hydrogenated carbon (Ti—C;H) films by high-power plasma-sputtering", Applied Surface Science, vol. 258, Dec. 16, 2011, pp. 3433-3437.

Tomas Vitu et al., "Structure and tribology of biocompatible Ti—C:H coatings", Surface & Coatings Technology, vol. 202, Jun. 9, 2008, pp. 5790-5793.

J.-E. Sundgren et al., "Mechanisms of reactive Sputtering of Titanium Nitride and Titanium Carbide—II: Morphology and Structure", Thin Solid Films, vol. 105, Jul. 29, 1983, pp. 367-384.

International Search Report issued with respect to Patent Application No. PCT/JP2016/086338, dated Feb. 7, 2017.

International Preliminary Report on Patentability issued with respect to Patent Application No. PCT/JP2016/086338, dated Jun. 12, 2018.

* cited by examiner

INTERMEDIATE LAYER FORMED BETWEEN BASE MATERIAL AND DLC LAYER AND FILM-FORMING METHOD THEREOF

TECHNICAL FIELD

The present invention relates to an intermediate layer formed between a base material and a DLC (Diamond-Like Carbon) layer. Note that a "DLC film" in this description means a film composed of the intermediate layer formed on a surface of the base material and the DLC layer formed on a surface of the intermediate layer.

BACKGROUND ART

Application of the DLC film to machine parts such as automotive parts has been in progress due to its high hardness, low friction, low attackability to a mating member, or the like. In the meantime, the DLC film has a large internal stress, to thus be peeled off from the base material easily. Therefore, such an interface control as to form the intermediate layer between the base material and the DLC layer has been conventionally performed, to thereby secure adhesion between the base material and the DLC film.

As such a prior art relating to the intermediate layer as described above, there has been described in Patent Document 1 a method of forming an intermediate layer composed of a Ti layer and a TiC layer between a base material and a DLC layer. In Patent Document 1, in order to avoid an effect on the base material, the intermediate layer is formed on a surface of the base material by using a PVD method that enables film formation at low temperature.

PRIOR ART DOCUMENT

Patent Document

Patent Document 1: International Publication No. 2015/068776

DISCLOSURE OF THE INVENTION

Problems to be Solved by the Invention

However, it is possible for a DLC film-coated member obtained by a manufacturing method in Patent Document 1 to expect an improvement in adhesion of the DLC layer seen in the Rockwell indentation test, but in the case of sliding the DLC film-coated member with a high load, peeling occurs at the interface between the intermediate layer and the DLC layer, resulting in that there has been a possibility that seizure occurs between the DLC film-peeled member and a mating member. Therefore, improvement in seizure resistance of the DLC film-coated member when sliding with a high load has been desired.

The present invention has been made in consideration of the above-described circumstances, and an object thereof is to suppress peeling at an interface between an intermediate layer and a DLC layer that occurs at the time of sliding with a high load and to improve seizure resistance of a DLC film-coated member.

Means for Solving the Problems

The present invention that solves the above-described problems is an intermediate layer formed between a base material and a DLC layer, the intermediate layer including: a Ti layer and a TiC layer formed on a surface of the Ti layer, in which a carbon content of the entire layer including the Ti layer and the TiC layer is 53 at % or more and 77 at % or less.

Further, the present invention according to another aspect is a film-forming method of an intermediate layer formed between a base material and a DLC layer by using a sputtering method, the film-forming method including: a Ti layer film-forming step of forming a Ti layer on a surface of the base material; and a TiC layer film-forming step of forming a TiC layer on a surface of the Ti layer, in which in the TiC layer film-forming step, an argon gas and an acetylene gas are supplied into a chamber into which the base material is carried, and a flow rate ratio between the argon gas and the acetylene gas is set to be within a range of 93.5:6.5 to 83:17 to form the TiC layer.

Effect of the Invention

According to the present invention, it becomes possible to suppress peeling at an interface between an intermediate layer and a DLC layer that occurs at the time of sliding with a high load and to improve seizure resistance of a DLC film-coated member.

MODE FOR CARRYING OUT THE INVENTION

Hereinafter, there will be explained one embodiment of the present invention with reference to the drawings. Incidentally, in this description and the drawings, the same reference numerals and symbols are added to components having substantially the same functional constitutions, and thereby their redundant explanations are omitted.

Figure 1:
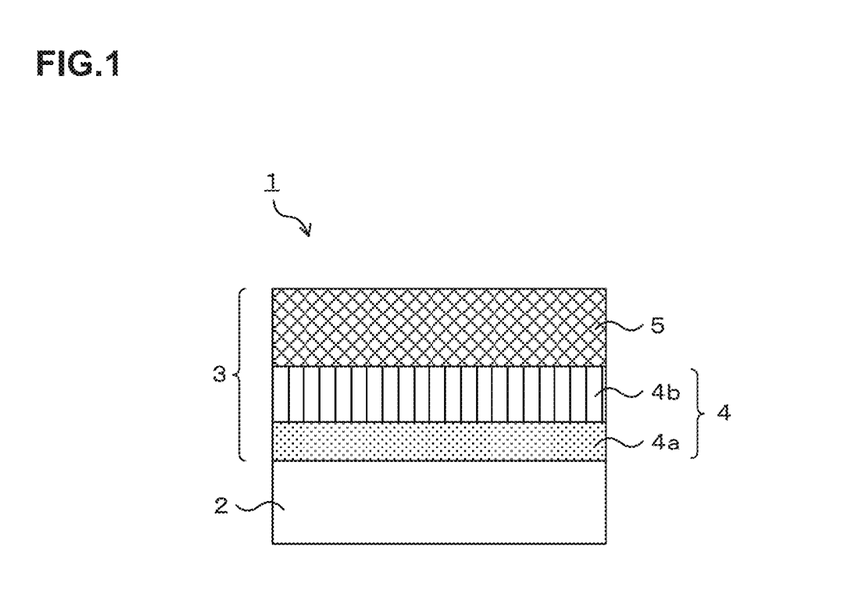
FIG. 1 is a view illustrating a schematic film structure of a DLC film-coated member according to one embodiment of the present invention.

As illustrated in FIG. 1, a DLC film-coated member 1 according to this embodiment is that a DLC film 3 is formed on a surface of a base material 2. The DLC film 3 is composed of an intermediate layer 4 formed on the surface of the base material and a DLC layer 5 formed on a surface of the intermediate layer 4. The intermediate layer 4 in this embodiment is composed of a Ti layer 4a formed on the surface of the base material 2 and a TiC layer 4b formed on a surface of the Ti layer 4a.

Then, in this embodiment, the carbon content of the entire intermediate layer containing the Ti layer 4a and the TiC layer 4b is 53 at % or more and 77 at % or less. The carbon content of the intermediate layer 4 is as above, thereby making it possible to improve seizure resistance of the DLC film-coated member 1 when sliding with a high load. In the meantime, when the carbon content of the intermediate layer 4 is less than 53 at %, in the layer of the TiC layer 4b, the peak of a Raman spectrum found by a later-described spectroscopic analysis is not seen, and thus it is conceivable that the intermediate layer does not have carbon having such a structure as the DLC. Therefore, it is conceivable that the adhesion decreases due to the difference in structure between the TiC layer 4b and the DLC layer 5. Further, when the carbon content of the intermediate layer 4 exceeds 77 at %, the layer structure of the TiC layer 4b becomes granular, and then the strength of the TiC layer decreases and the adhesion between the Ti layer and the TiC layer when sliding with a high load decreases, and thereby the seizure resistance decreases. The further preferred lower limit of the carbon content of the intermediate layer 4 is 55 at %. Further, the further preferred upper limit of the carbon content of the intermediate layer 4 is 75 at %.

Incidentally, the TiC layer 4b is a layer containing titanium and carbon, and as its balance, sometimes contains elements other than titanium and carbon inevitably. However, in terms of the seizure resistance when sliding with a high load, it is possible to ignore the effect of the elements to be mixed inevitably. Further, ultramicro amounts of carbon and the like are sometimes contained inevitably also in the Ti layer 4a, but in terms of the seizure resistance when sliding with a high load, the elements to be mixed inevitably may also be ignored.

Next, there will be explained a film-forming method of the intermediate layer 4 formed between the base material 2 and the DLC layer 5 and a manufacturing method of the DLC film-coated member 1.

In this embodiment, the intermediate layer 4 is formed by using a unbalanced magnetron sputtering (what is called a UBM sputtering) method being one example of a sputtering method. Incidentally, as an apparatus that film-forms the intermediate layer 4 and the DLC layer 5, there is used a UBM sputtering apparatus capable of performing film-forming processings of the intermediate layer 4 and the DLC layer 5 in the same chamber. This UBM sputtering apparatus is a well-known one, so that the explanation of the apparatus structure and the like is omitted in this description. Further, the film-forming method of the DLC layer 5 is not limited in particular, but a plasma CVD method is used in this embodiment.

(Film-Forming Preprocessing)

First, the base material 2 made of an iron-based material such as SCM415, SUS310, or SKD11 is carried into a chamber of the UBM sputtering apparatus. Subsequently, the inside of the camber is vacuumed and the pressure is reduced to, for example, about $2.6 \times 10^{-3}$ Pa. Thereafter, the temperature of a heater is set to 700° C., the base material 2 is heated up to about 180° C., and an argon (Ar) gas is introduced. Then, the base material 2 is heated by a tungsten filament, and at the same time, an output of a pulse power supply for bias is adjusted, and a bias voltage of −300 V or more and −400 V or less is applied to the base material 2. Thereby, an argon bombardment treatment of the base material 2 is performed and cleaning of the surface of the base material is performed.

(Ti Layer Film-Forming Step)

Next, a flow rate of the argon gas supplied into the chamber is adjusted, and the chamber internal pressure (to be referred to as a "film-forming pressure" hereinafter) is adjusted to be within a range of 0.1 Pa or more and 1.0 Pa or less, for example. Further, the output of the pulse power supply for bias is adjusted and a bias voltage of −100 V or more and −500 V or less is applied to the base material 2. Thereby, the plasmatized argon gas collides with a Ti target disposed inside the chamber and Ti sputtered from the surface of the Ti target heads to the base material 2. Thereby, the Ti layer 4a is formed on the surface of the base material. Such film-forming processing is performed for a predetermined period of time, and then the Ti layer film-forming step is finished. Incidentally, in this embodiment, the film-forming pressure and the bias voltage in the Ti layer film-forming step are set to be constant during the film-forming processing.

The film thickness of the Ti layer 4a is preferred to be 0.1 μm or more and 0.3 μm or less. When the film thickness of the Ti layer 4a is less than 0.1 μm, the Ti layer 4a, which is soft, becomes too thin, and thereby it becomes difficult for the DLC film 3 to follow deformation of the base material, and there is a possibility that the adhesion between the base material 2 and the DLC film 3 decreases consequently. On the other hand, when the film thickness of the Ti layer 4a exceeds 0.3 μm, the proportion of the Ti layer 4a, which is soft, to the entire intermediate layer increases and destruction inside the Ti layer occurs, and there is a possibility that the seizure resistance decreases consequently. The further preferred upper limit of the film thickness of the Ti layer 4a is 0.2 μm.

(TiC Layer Film-Forming Step)

After the Ti layer film-forming step is finished, the TiC layer 4b is film-formed so that the carbon content of the intermediate layer becomes 53 at % or more and 77 at % or less. First, an acetylene ($C_2H_2$) gas is further supplied into the chamber into which the argon gas has been supplied. At this time, supply amounts of the respective gases are adjusted so as to make a flow rate ratio between the argon gas and the acetylene gas fall within a range of 93.5:6.5 to 83:17. When the flow rate ratio of the acetylene gas becomes smaller than 6.5, the carbon content of the intermediate layer 4 is reduced and the adhesion decreases. On the other hand, when the flow rate ratio of the acetylene gas becomes larger than 17, the carbon content increases too much, and thereby the TiC layer 4b grows granularly. Thereby, the seizure resistance decreases.

The lower limit of the above-described flow rate ratio of the acetylene gas is more preferred to be 9. This makes it possible to improve the adhesion between the base material 2 and the DLC film 3. Further, the upper limit of the above-described flow rate ratio of the acetylene gas is more preferably set to 12.5. This makes it possible to improve the adhesion between the base material 2 and the DLC film 3.

The supply amounts of the respective gases are set so as to make the film-forming pressure in the TiC layer film-forming step fall within a range of 0.1 Pa or more and 1.0 Pa or less, for example. Making the film-forming pressure in the TiC layer film-forming step smaller than 0.1 Pa makes it difficult to control the flow rate ratio between the gases, and at the same time, a film-forming rate slows down, and there is a possibility that the productivity decreases consequently. On the other hand, when the film-forming pressure in the TiC layer film-forming step is larger than 1.0 Pa, a mean free path becomes short and energy of Ti particles decreases. Therefore, the TiC layer 4b does not crystallize well, and there is a possibility that the adhesion and the seizure resistance decrease consequently. Incidentally, the preferred lower limit of the film-forming pressure in the TiC layer film-forming step is 0.2 Pa. Further, the preferred upper limit of the film-forming pressure in the TiC layer film-forming step is 0.5 Pa.

A bias voltage in the TiC layer film-forming step is set to −50 V or more and −500 V or less, for example. When the bias voltage in the TiC layer film-forming step is smaller than −50 V, the force to pull ions weakens and the TiC layer 4b does not crystallize well, and thus there is a possibility that the adhesion and the seizure resistance decrease. On the other hand, when the bias voltage in the TiC layer film-forming step is larger than −500 V, an arc discharge occurs during the film-forming, and there is a possibility that a stable discharge is no longer enabled consequently. In this embodiment, the film-forming pressure and the bias voltage in the TiC layer film-forming step are set to be constant during the film-forming processing. Incidentally, in this description, in terms of expression of magnitude to be used when comparing the bias voltages, the bias voltage with a smaller absolute value is expressed that the "bias voltage is small."

The lower limit of the bias voltage in the TiC layer film-forming step is more preferably set to −100 V. Further, the upper limit of the bias voltage in the TiC layer film-forming step is more preferably set to −200 V. Further, the bias voltage in the TiC layer film-forming step is preferably set to be smaller than the bias voltage in the Ti layer film-forming step.

The film-forming processing is performed under the above-described conditions, and thereby the TiC layer 4b is formed on the surface of the Ti layer 4a. Such film-forming processing is performed for a predetermined period of time, and then the TiC layer film-forming step is finished. Incidentally, the film thickness of the TiC layer 4b is preferred to be 0.2 μm or more and 0.4 μm or less. The film thickness of the intermediate layer 4, which is too thick, is not preferred, and thus the film thickness of the entire intermediate layer is to be limited in some degree. Therefore, when the film thickness of the TiC layer 4b is less than 0.2 μm, the proportion of the Ti layer 4a, which is soft relatively, increases and destruction inside the Ti layer occurs, and there is a possibility that the seizure resistance decreases consequently. On the other hand, when the film thickness of the TiC layer 4b exceeds 0.4 μm, the Ti layer 4a becomes thin relatively and it becomes difficult for the DLC film 3 to follow deformation of the base material, and there is a possibility that the adhesion between the base material 2 and the DLC film 3 decreases consequently. The further preferred lower limit of the film thickness of the TiC layer 4b is 0.3 μm.

As described above, through the above-described Ti layer film-forming step and TiC layer film-forming step, the intermediate layer 4 composed of the Ti layer 4a and the TiC layer 4b is formed on the surface of the base material 2. Subsequently, the DLC layer 5 is film-formed on the surface of this intermediate layer 4.

(DLC Layer Film-Forming Step)

The supply of the argon gas that has been being supplied into the chamber is stopped to make a state where only the acetylene gas is being supplied into the chamber. The acetylene gas is adjusted so as to make the film-forming pressure fall within a range of 0.1 Pa or more and 1 Pa or less, for example. Besides, the output of the power supply and the like are adjusted appropriately, and by the plasma CVD method that has been performed conventionally, the DLC layer 5 is formed on the surface of the intermediate layer 4. Thereby, the DLC film 3 is formed on the surface of the base material 2 and the DLC film-coated member 1 according to this embodiment is obtained.

In the DLC film-coated member 1 obtained in this manner, the seizure resistance when sliding with a high load has improved because the carbon content of the intermediate layer 4 is 53 at % or more and 77 at % or less.

Incidentally, the film thickness of the DLC layer 5 is preferred to be 0.5 μm or more and 2.5 μm or less. When the film thickness of the DLC layer 5 is less than 0.5 μm, disappearance of the DLC layer 5 caused by its abrasion accelerates, and there is a possibility that the seizure resistance decreases consequently. On the other hand, when the film thickness of the DLC layer 5 exceeds 2.5 μm, a film stress of the DLC layer 5 increases, and there is a possibility that the adhesion decreases consequently. The further preferred lower limit of the film thickness of the DLC layer 5 is 1 μm. Further, the further preferred upper limit of the film thickness of the DLC layer 5 is 1.5 μm.

Further, an indentation hardness $H_{IT}$ of the DLC film 3 measured by a nano-indentation method is preferred to be 10 GPa or more and 25 GPa or less. When the indentation hardness $H_{IT}$ of the DLC film 3 is less than 10 GPa, the DLC layer 5 becomes likely to be abraded, and there is a possibility that the seizure resistance decreases consequently. On the other hand, when the indentation hardness $H_{IT}$ of the DLC film 3 exceeds 25 GPa, the film stress of the DLC layer 5 increases, and there is a possibility that the adhesion decreases consequently. The further preferred lower limit of the indentation hardness $H_{IT}$ of the DLC film 3 is 20 GPa.

In the foregoing, the preferred embodiment of the present invention has been described, but the present invention is not limited to such an example. It is apparent that those skilled in the art are able to devise various variation or modification examples within the scope of the technical spirit described in the claims, and it should be understood that such examples belong to the technical scope of the present invention as a matter of course.

Figure 2:
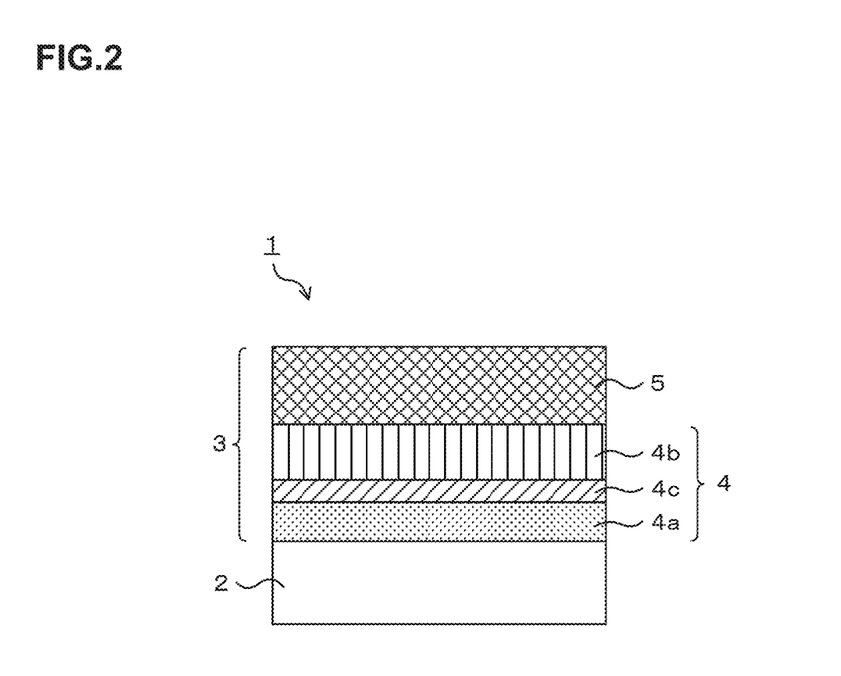
FIG. 2 is a view illustrating a schematic film structure of a DLC film-coated member according to another embodiment of the present invention.

As illustrated in FIG. 2, for example, between the Ti layer 4a and the TiC layer 4b that compose the intermediate layer 4, a TiC graded layer 4c in which a composition changes continuously may be formed. The TiC graded layer 4c is a layer in which the content of titanium gradually decreases with respect to the content of carbon from an interface with the Ti layer 4a to an interface with the TiC layer 4b. That is, in the vicinity of the Ti layer 4a, the content of titanium is relatively larger than the content of carbon, and in the vicinity of the TiC layer 4b, the content of titanium is relatively smaller than the content of carbon. Formation of such a TiC graded layer 4c makes it possible to improve the adhesion between the base material 2 and the DLC film 3. In order to form the TiC graded layer 4c, it is only necessary to provide a TiC graded layer film-forming step between the Ti layer film-forming step and the TiC layer film-forming step, in which at least one of, for example, the flow rate ratio between the argon gas and the acetylene gas, the film-forming pressure, the bias voltage, and the like is changed continuously during film-forming processing.

Example

The intermediate layer and the DLC layer were film-formed on each of prepared test pieces under different processing conditions, and properties of the respective test pieces were evaluated. Incidentally, in this example, as the test piece, a SCM415 was used and as the UBM sputtering apparatus, a UBMS707 manufactured by Kobe Steel, Ltd. was used.

(Film-Forming Preprocessing)

First, the test piece was subjected to a carburizing and quenching treatment and then subjected to tempering at 200° C. for one hour. Thereafter, the test piece was polished until a maximum height roughness Rz of its surface became 0.4 μm or less, and the test piece was immersed in a SOL-MIXAP-1 produced by JAPAN ALCOHOL TRADING COMPANY LIMITED to be subjected to ultrasonic cleaning for three minutes. After the ultrasonic cleaning was finished, the test piece was subjected to nitrogen blowing to then be dried, and the test piece was carried into a chamber of the UBM sputtering apparatus. Thereafter, the chamber was evacuated and the pressure inside the chamber was reduced to $2.6 \times 10^{-3}$ Pa.

Subsequently, the base material was subjected to a heat treatment and an argon bombardment treatment under predetermined conditions. Concretely, a set temperature of a heater was first set to 700° C. and the base material was heated for 30 minutes (step (a)). Thereafter, the heater was stopped and the base material was left to stand for five minutes (step (b)). Thereafter, the flow rate of an argon gas was set to 960 ml/min, a current of 10 A was applied to a tungsten filament, and at the same time, a bias voltage of −300 V was applied to the base material, of which state was maintained for one minute (step (c)). Then, the application of the current to the tungsten filament and the application of the bias voltage to the base material were stopped and the base material were left to stand for one minute (step (d)). Thereafter, the above-described step (c) was performed again. In this manner, the step (c) to the step (d) were performed five times repeatedly. After the fifth step (d) was finished, a current of 10 A was applied to the tungsten filament and at the same time, a bias voltage of −400 V was applied to the base material, of which state was maintained for one minute (step (e)). Subsequently, the application of the current to the tungsten filament and the application of the bias voltage to the base material were stopped for one minute (step (f)). Thereafter, the above-described step (e) was performed again. In this manner, the step (e) to the step (f) were performed 10 times repeatedly and the surface of the base material was cleaned.

Subsequently, film-forming processing of the Ti layer and film-forming processing of the TiC layer were performed under the conditions illustrated in Table 1 below.

TABLE 1

|  | Ti LAYER FILM-FORMING STEP | TiC LAYER FILM-FORMING STEP |
| --- | --- | --- |
| PROCESSING TIME (MINUTE) | 15 | 105 |
| Ti SPUTTERING POWER (kW) | 6 | 6 |
| BIAS VOLTAGE (V) | −200 | −100 |
| ARGON GAS (ml/min) | 300 | CONDITION IN TABLE 2 |
| ACETYLENE GAS (ml/min) | 0 | CONDITION IN TABLE 2 |
| CHAMBER INTERNAL SET PRESSURE (Pa) | 0.4 | 0.4 |
| FORMED FILM THICKNESS (µm) | 0.1 | 0.45 |

(Ti Layer Film-Forming Step)

After the argon bombardment treatment was finished, the flow rate of the argon gas was adjusted to bring the chamber internal pressure to 0.4 Pa. Thereafter, the bias voltage to be applied to the base material was changed to −200 V, and at the same time, the output of a pulse power supply for sputtering was set to 6 kW. Thereby, the argon gas was plasmatized and sputtering of a Ti target was started. The state was maintained for 15 minutes, and the Ti layer of 0.1 µm was formed on the surface of the base material.

(TiC Layer Film-Forming Step)

Subsequently, an acetylene gas was introduced into the chamber and the bias voltage to be applied to the base material was changed to −100 V. At this time, the flow rate of the argon gas was also adjusted so as to maintain the chamber internal pressure to 0.4 Pa. By the acetylene gas introduction, a carbon source was supplied to the base material, and film-forming of the TiC layer was started. The state was maintained for 105 minutes, and the TiC layer of 0.45 µm was formed on a surface of the Ti layer. In this example, the TiC layer was formed on each of the test pieces by changing the flow rate ratio between the argon gas and the acetylene gas that compose a film-forming gas in the TiC layer film-forming step. The condition of the flow rate ratio is as illustrated in Table 2 below.

TABLE 2

|  | ARGON GAS (ml/min) | ACETYLENE GAS (ml/min) | FLOW RATE RATIO Ar:C2H2 |
| --- | --- | --- | --- |
| COMPARATIVE EXAMPLE 1 | 285 | 15 | 95:5 |
| EXAMPLE 1 | 277.5 | 22.5 | 92.5:7.5 |
| EXAMPLE 2 | 273 | 27 | 91:9 |
| EXAMPLE 3 | 270 | 30 | 90:10 |
| EXAMPLE 4 | 262.5 | 37.5 | 87.5:12.5 |
| EXAMPLE 5 | 255 | 45 | 85:15 |
| COMPARATIVE EXAMPLE 2 | 240 | 60 | 80:20 |

(DLC Layer Film-Forming Step)

After the TiC layer film-formation was finished, the supply of the argon gas was stopped and a supply amount of the acetylene gas was adjusted, to bring the chamber internal pressure to 1 Pa. The flow rate of acetylene at this time is about 1000 ml/min. Then, by control of the heater, the surface of the test piece was heated up to 180° C., a discharge voltage of the pulse power supply was set to −1.05 kV, a Duty ratio was set to 30%, a frequency was set to 25 kHz, and film-forming processing was performed for 75 minutes by a plasma CVD method. Thereby, the DLC layer of 1.5 µm was formed on a surface of the TiC layer.

A Falex test and a Rockwell indentation test were performed on each of the test pieces obtained by going through the above steps, and the seizure resistance and the adhesion of the DLC film of each of the test pieces were evaluated.

(Falex Test)

The test was started at the stage where an oil temperature became 65±1° C. and the test piece became 60±1° C. by heater heating. At first, without rotation of the test piece, a load of 500N was added to the test piece by a V block, of which state was maintained for one minute. Thereafter, while rotating the test piece at 300 rpm, the load to be added to the test piece was increased by 500N every one minute. Then, a tester was stopped when a friction coefficient increased rapidly and abnormal noise occurred, and the added load at that time was recorded as a seizure load.

(Rockwell Indentation Test)

An indentation was formed in each of the test pieces with an initial test force of 98.07 N and a total test force of 1471 N by using a Rockwell C-scale indenter (diamond with a pointed end of 0.2 mm in radius of curvature and with a cone angle of 120° in conformity with JIS Z 2245). Then, the state of peeling of the DLC film in a peripheral portion of the indentation was observed by a metallurgical microscope, to evaluate the adhesion by a HF value.

The seizure loads of the respective test pieces measured by the Falex test and results of the adhesion evaluations of the respective test pieces by the Rockwell indentation test are illustrated in Table 3 below. Incidentally, the percent expression of the acetylene flow rate ratio in the following explanation indicates the percentage of the acetylene gas flow rate to the total flow rate of the film-forming gas when the total flow rate of the film-forming gas composed of the argon gas and the acetylene gas is set to 100%.

TABLE 3

| | ACETYLENE FLOW RATE RATIO IN TiC LAYER FILM-FORMING STEP | SEIZURE LOAD (N) | ADHESION EVALUATION (HF VALUE) |
|---|---|---|---|
| COMPARATIVE EXAMPLE 1 | 5.0% | 6250 | 4 |
| EXAMPLE 1 | 7.5% | 8500 | 3 |
| EXAMPLE 2 | 9.0% | 9750 | 2 |
| EXAMPLE 3 | 10.0% | 10000 | 2 |
| EXAMPLE 4 | 12.5% | 9500 | 2 |
| EXAMPLE 5 | 15.0% | 9750 | 3 |
| COMPARATIVE EXAMPLE 2 | 20.0% | 5500 | 1 |

As illustrated in Table 3, the seizure load in the case of the acetylene flow rate ratio in the TiC layer film-forming step being 7.5% or more and 15% or less has increased dramatically rather than the seizure load in the case of the acetylene flow rate ratio being 5% or 20%. The results illustrated in Table 3 reveal that the acetylene flow rate ratio is set to about 6.5 or more and 17% or less in the TiC film-forming step, thereby improving the seizure resistance of the DLC film-coated member. Further, according to the results illustrated in Table 3, in the case of the acetylene flow rate ratio set to 9% or more, it is possible to further improve the seizure resistance as compared to the case of the acetylene flow rate ratio set to 7.5%.

Further, as illustrated in Table 3, in the case of the acetylene flow rate ratio in the TiC layer film-forming step being 7.5% or more and 15% or less, it is possible to obtain sufficient adhesion. That is, it is found out that as long as the acetylene flow rate ratio in the TiC layer film-forming step is about 6.5% or more and 17% or less, sufficient seizure resistance and adhesion can be obtained. Further, the results illustrated in Table 3 reveal that in the case of the acetylene flow rate ratio being 9% or more and 12.5% or less, the adhesion further improves.

As illustrated in the above results, controlling the acetylene flow rate ratio in the TiC film-forming step makes it possible to improve the seizure resistance of the DLC film-coated member. Next, the factor in causing differences in properties among the respective test pieces was examined.

(XRD measurement)

A RiNT2000 manufactured by Rigaku Corporation was used to perform an XRD measurement on the surface of the test piece at the stage of the TiC layer film-formed thereon by using a Cu tube. The conditions of the XRD measurement were set as follows, and a full width at half maximum (FWHM) and an intensity of the TiC peak of the (111) plane (to be referred to as the TiC (111) peak hereinafter) were evaluated. Results are as illustrated in Table 4 below.

X ray output: 40 kV, 20 mA
Scan speed: 1.0 sec
Step width: 0.05°
Scan width: 2θ/θ
Scan range: 20° to 80°

TABLE 4

| | ACETYLENE FLOW RATE RATIO IN TiC LAYER FILM-FORMING STEP | FWHM | TiC (111) PEAK INTENSITY |
|---|---|---|---|
| COMPARATIVE EXAMPLE 1 | 5.0% | 1.57° | 81 cps |
| EXAMPLE 1 | 7.5% | 1.22° | 117 cps |
| EXAMPLE 3 | 10.0% | 0.69° | 147 cps |
| EXAMPLE 5 | 15.0% | 1.70° | 41 cps |
| COMPARATIVE EXAMPLE 2 | 20.0% | 1.30° | 17 cps |

As illustrated in Table 4, in the case of the acetylene flow rate ratio being 10%, the full width at half maximum of the TiC (111) peak was the narrowest and the peak intensity increased most. In the case of the acetylene flow rate ratio being greater than 15%, the TiC (111) peak became broad rapidly, and in the case of the acetylene flow rate ratio being 20%, the TiC (111) peak intensity decreased extremely as compared to the other cases. The reason why such results were obtained is conceivable because in the case of the acetylene flow rate ratio being too large, the TiC layer does not grow to have a columnar shape and crystallinity deteriorates.

(Raman Spectroscopic Analysis)

Subsequently, by using a microscopic Raman spectroscopic analyzer, a Raman spectroscopic analysis was performed on the test piece at the stage of the TiC layer being film-formed thereon. The analysis conditions are as follows.

Exposure time: 30 sec
Excitation wavelength: 532.22 nm
Grating: 600 l/mm
Slit width: ϕ50 μm
Aperture: ϕ40 μm
Laser intensity: 3.8 mW Peak separation was performed with respect to the D peak and the G peak of a Raman spectrum found by the spectroscopic analysis to find an intensity ratio (ID/IG ratio) of a peak intensity ID of a D band and a peak intensity IG of a G band. Results thereof are illustrated in Table 5 below.

TABLE 5

| | ACETYLENE FLOW RATE RATIO IN TiC LAYER FILM-FORMING STEP | ID/IG RATIO |
|---|---|---|
| COMPARATIVE EXAMPLE 1 | 5.0% | NO PEAK |
| EXAMPLE 1 | 7.5% | 0.05 |
| EXAMPLE 3 | 10.0% | 4 |
| EXAMPLE 5 | 15.0% | 3.7 |
| COMPARATIVE EXAMPLE 2 | 20.0% | 3.3 |

Figure 3:
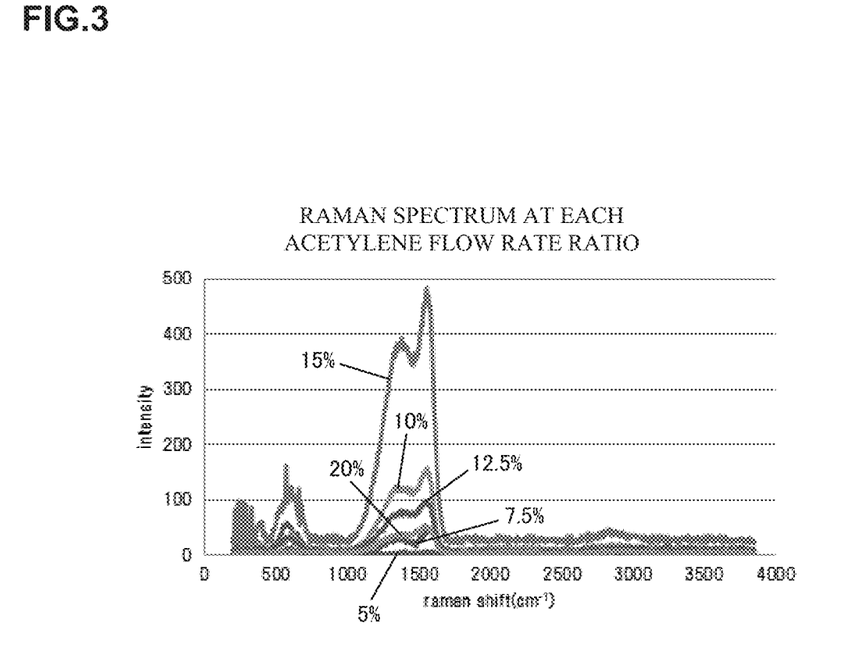
FIG. 3 is a chart illustrating the relationship between an acetylene flow rate ratio in a TiC layer film-forming step and a Raman spectrum of a TiC layer formed at the flow rate ratio.

As illustrated in Table 5, the ID/IG ratio of the Raman spectrum became maximum in the case of the acetylene flow rate ratio being 15%. On the other hand, as illustrated also in FIG. 3, in the case of the acetylene flow rate ratio being 5%, the peak of the Raman spectrum was not seen. According to the results illustrated in Table 5, the reason why the seizure resistance and the adhesion decrease in the case of the acetylene flow rate ratio being small is conceivable because the content of carbon having such a structure as the DLC is small in the TiC layer and the change in structure of the TiC layer and the DLC layer is large.

(FE-SEM Cross Section Observation)

Next, by using a FE-SEM, a fracture surface of each of the test pieces each having had the DLC film formed thereon was observed. As a result, it was confirmed that in the case of the acetylene flow rate ratio being 7.5% and 10%, the TiC layer grows to have a columnar shape and in the case of the acetylene flow rate ratio being 20%, the TiC layer grows granularly.

(Carbon Concentration Analysis of the Intermediate Layer)

In order to examine the relationship between the carbon content of the intermediate layer and the seizure resistance, by using a FE-EPMA, an elemental analysis was performed on the test pieces each at the stage of the TiC layer being film-formed thereon. Apparatus specifications are as follows.

EPMA: JXA-8530F manufactured by JEOL Ltd.
X-ray spectroscope: Wavelength-dispersive X-ray spectrometer (WDS)
Dispersive crystal: TAP, PETH, LIFH, LDE1H, LDE6H In the elemental analysis, the test piece is first introduced into a sample chamber of the EPMA, and with an acceleration voltage set to 15 kV and a probe current set to $1.0 \times 10^{-7}$ A, an electron beam irradiates the surface of the test piece on the TiC layer film-formed side. The X-ray spectroscope measures the wavelength and the intensity of characteristic X-rays generated from the test piece thereby. Then, based on the peak position of the wavelength, elements contained in a measurement range are examined, and at the same time, a chemical composition is calculated from the peak intensity by using a ZAF correction method.

In the meantime, in this example, the film thickness of the Ti layer is 0.1 µm and the film thickness of the TiC layer is 0.45 µm, and thus the base material is contained in a range to be measured by the EPMA. Thus, the chemical composition measured by the above-described method is the chemical composition affected by the base material, and is not the chemical composition of the only intermediate layer. Therefore, in order to calculate the carbon content of the intermediate layer, it is necessary to exclude the base material-derived carbon content.

Thus, by using the EPMA, the elemental analysis of the test piece prior to the intermediate layer film-formation was performed by the method similar to that of the elemental analysis of the previously described TiC layer. The chemical composition of the test piece prior to the intermediate layer film-formation is as illustrated in Table 6 below.

TABLE 6

| | | BASE MATERIAL (SCM415) |
|---|---|---|
| CHEMICAL COMPOSITION [at %] | C | 4.4 |
| | O | 2.1 |
| | Si | 0.6 |
| | Cr | 1.1 |
| | Mn | 1.0 |
| | Fe | 90.8 |

The carbon content of the intermediate layer [at %] calculated based on the chemical composition illustrated in Table 6 is as illustrated in Table 7 below. Incidentally, "BASE MATERIAL-DERIVED C" in Table 7 is calculated by {(C [at %] in Table 6/Fe [at %] in Table 6)×Fe [at %] of the EPMA analysis result in Table 7}.

TABLE 7

| | | COMPARATIVE EXAMPLE 1 | EXAMPLE 1 | EXAMPLE 3 | EXAMPLE 5 | COMPARATIVE EXAMPLE 2 |
|---|---|---|---|---|---|---|
| ACETYLENE FLOW RATE RATIO IN TIC LAYER FILM-FORMING STEP | | 5% | 7.5% | 10% | 15% | 20% |
| (EPMA ANALYSIS RESULT) FILM COMPOSITION [at %] | C | 46.0 | 52.0 | 57.7 | 63.0 | 71.9 |
| | O | 3.4 | 3.4 | 4.7 | 6.0 | 2.8 |
| | Si | 0.0 | 0.0 | 0.0 | 0.0 | 0.1 |
| | Ar | 0.6 | 0.6 | 0.4 | 0.3 | 0.4 |
| | Ti | 43.8 | 39.3 | 31.2 | 24.6 | 18.5 |
| | Cr | 0.2 | 0.0 | 0.3 | 0.2 | 0.2 |
| | Fe | 5.9 | 4.7 | 5.6 | 5.8 | 6.0 |
| | Mn | 0.0 | 0.0 | 0.0 | 0.1 | 0.1 |
| BASE MATERIAL-DERIVED C [at %] | | 0.29 | 0.23 | 0.28 | 0.28 | 0.29 |
| at % C EXCLUDING BASE MATERIAL-DERIVED C/at % Ti | | 1.04 | 1.32 | 1.84 | 2.55 | 3.87 |
| INTERMEDIATE LAYER CHEMICAL COMPOSITION | at % C | 51.0 | 56.9 | 64.8 | 71.8 | 79.5 |
| | at % Ti | 49.0 | 43.1 | 35.2 | 28.2 | 20.5 |

With a view to the results of Table 3 and the results of Table 7, it is found out that the carbon content of the intermediate layer only needs to be 53 at % or more and 77 at % or less in order to obtain sufficient seizure resistance and adhesion.

(Carbon Content in the Case of Using a Methane Gas)

In place of the acetylene gas, a methane gas was used as the film-forming gas to be used in the TiC layer film-forming step to perform film-forming processing of the TiC layer, and the chemical composition of the intermediate layer at this time was analyzed. Further, the DLC layer was formed on a surface of the TiC layer formed by using the methane gas, and an indentation hardness $H_{IT}$ of a DLC film-coated member was measured. These results are illustrated in Table 8 below. Incidentally, processing conditions other than the film-forming gas in the TiC layer film-forming step are the same as those in Example 3.

TABLE 8

| | EXAMPLE 3 | COMPARATIVE EXAMPLE 3 |
|---|---|---|
| TiC LAYER FILM-FORMING GAS | ACETYLENE | METHANE |
| FILM-FORMING GAS FLOW RATE RATIO IN TiC LAYER FILM-FORMING STEP | 10% | 10% |
| at % C | 64.8 | 35.6 |
| at % Ti | 35.2 | 64.4 |
| HARDNESS $H_{IT}$ [GPa] | 15.1 | 15.9 |

As illustrated in Table 8, the indentation hardness $H_{IT}$ of the DLC film-coated member in the case of film-forming the TiC layer with the methane gas was equal to that in the case of film-forming the TiC layer with the acetylene gas. Therefore, a sufficient hardness as the DLC film-coated member can be secured even in the case of using the methane gas. In the meantime, in the case of film-forming the TiC layer using the methane gas, the carbon content of the intermediate layer became about 35%. When the carbon content of the intermediate layer is low as above, the seizure resistance decreases as is clear from the results in Table 3 and Table 7. Accordingly, it is preferred to use the acetylene gas as the film-forming gas in the TiC layer film-forming step.

INDUSTRIAL APPLICABILITY

The present invention is applicable to manufacture of a DLC film-coated member.

EXPLANATION OF CODES

1 DLC film-coated member
2 base material
4a Ti layer
4b TiC layer
4c TiC graded layer
5 DLC layer

The invention claimed is:

1. A film-forming method of an intermediate layer formed between a base material and a DLC layer by using a sputtering method, the film-forming method comprising:
   forming a Ti layer on a surface of the base material; and
   forming a TiC layer on a surface of the Ti layer, wherein
      in the forming the TiC layer, an argon gas and an acetylene gas are supplied into a chamber into which the base material is carried, and
      a flow rate ratio between the argon gas and the acetylene gas is set to be within a range of 93.5:6.5 to 83:17 to form the TiC layer.
2. The film-forming method of the intermediate layer according to claim 1, further comprising:
   between the forming the Ti layer and the forming the TiC layer forming a TiC graded layer on the surface of the Ti layer.
3. A manufacturing method of a DLC film-coated member, comprising:
   forming an intermediate layer on a surface of a base material by using the film-forming method of the intermediate layer according to claim 1; and forming a DLC layer on a surface of the intermediate layer.
4. The method of claim 1, wherein a carbon content of the intermediate layer is 53 at % or more and 77 at % or less.
5. The method of claim 1, wherein the sputtering method is an unbalanced magnetron sputtering method.

* * * * *